(12) United States Patent
Kim et al.

(10) Patent No.: US 6,927,464 B2
(45) Date of Patent: Aug. 9, 2005

(54) FLAT PANEL DISPLAY DEVICE

(75) Inventors: Chang-Soo Kim, Seoul (KR);
Sang-Won Lee, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/390,719

(22) Filed: Mar. 19, 2003

(65) Prior Publication Data

US 2003/0181002 A1 Sep. 25, 2003

Related U.S. Application Data

(62) Division of application No. 10/121,676, filed on Apr. 15, 2002, now Pat. No. 6,617,203.

(30) Foreign Application Priority Data

Apr. 13, 2001 (KR) .............................. 10-2001-0019932

(51) Int. Cl.$^7$ .............................................. H01L 29/76
(52) U.S. Cl. ........................ 257/412; 257/310; 257/382
(58) Field of Search ................................ 257/412, 310, 257/382, 383, 411, 413, 761, 344, 401, 408, 59, 72, 350, 66; 438/149; 349/13, 111, 155

(56) References Cited

U.S. PATENT DOCUMENTS

| | | | |
|---|---|---|---|
| 5,985,708 A | | 11/1999 | Nakagawa et al. |
| 5,998,841 A | | 12/1999 | Suzawa |
| 6,046,479 A | | 4/2000 | Young et al. |
| 6,144,082 A | * | 11/2000 | Yamazaki et al. ......... 257/412 |
| 6,166,397 A | | 12/2000 | Yamazaki et al. |
| 6,166,414 A | | 12/2000 | Miyazaki et al. |
| 6,172,671 B1 | | 1/2001 | Shibuya et al. |
| 6,180,982 B1 | | 1/2001 | Zhang et al. |
| 6,246,070 B1 | * | 6/2001 | Yamazaki et al. ............ 257/40 |
| 6,281,552 B1 | * | 8/2001 | Kawasaki et al. .......... 257/350 |

(Continued)

FOREIGN PATENT DOCUMENTS

| | | | | |
|---|---|---|---|---|
| JP | 2002341355 A | * | 11/2002 | ......... G02F/1/1339 |
| KR | 2003096729 A | * | 12/2003 | ........... H05B/33/10 |

Primary Examiner—Laura M Schillinger
(74) Attorney, Agent, or Firm—McGuireWoods LLP

(57) ABSTRACT

A method of manufacturing a flat panel display device using fewer masks and resulting in a device with high brightness is disclosed. The resulting devices includes at least first to fourth thin film transistors, the first, third, and fourth thin film transistors having a first conductive type, and the second thin film transistors having a second conductive type. The method includes: a) providing a substrate having a non-display region on which the first thin film transistor and the second thin film transistor are formed, and a display region on which the third thin film transistor and the fourth thin film transistor are formed; b) forming first to fourth semiconductor layers of the first to the fourth thin film transistors on the substrate; c) forming a gate insulating layer over the whole surface of the substrate; d) forming first to fourth conductive patterns and a pixel electrode on the gate insulating layer, the first to fourth conductive patterns formed over the first to fourth semiconductor layers, the pixel electrode formed over a portion of the display region; e) forming first to fourth gate electrodes and a fifth conductive pattern, the first to fourth gate electrodes formed on the first to fourth conductive patterns, respectively, the fifth conductive pattern formed on the pixel electrode; f) ion-implanting a first conductive-type high-density impurity into the first, third, and fourth semiconductor layers to form first conductive-type high-density source and drain regions; g) etching the first to fourth conductive patterns using the first to fourth gate electrodes as an etching mask; h) forming a photoresist pattern to expose a portion of the non-display region corresponding to the second semiconductor layer; and i) ion-implanting a second conductive-type high-density impurity into the second semiconductor layer to form second conductive-type high-density source and drain regions.

14 Claims, 9 Drawing Sheets

U.S. PATENT DOCUMENTS

| | | | |
|---|---|---|---|
| 6,359,320 B1 * | 3/2002 | Yamazaki et al. | 257/408 |
| 6,373,075 B1 | 4/2002 | Yamazaki et al. | |
| 6,391,694 B1 | 5/2002 | Zhang et al. | |
| 6,429,057 B1 * | 8/2002 | Hong et al. | 438/158 |
| 6,429,485 B1 | 8/2002 | Ha et al. | |
| 6,429,921 B1 * | 8/2002 | Chen et al. | 349/155 |
| 6,451,635 B2 * | 9/2002 | Park et al. | 438/158 |
| 6,469,317 B1 * | 10/2002 | Yamazaki et al. | 257/59 |
| 6,489,176 B2 * | 12/2002 | Ninomiya | 438/30 |
| 6,524,896 B1 * | 2/2003 | Yamazaki et al. | 438/149 |
| 6,545,656 B1 * | 4/2003 | Yamazaki | 345/94 |
| 6,548,318 B2 * | 4/2003 | Chen et al. | 438/30 |
| 6,563,482 B1 * | 5/2003 | Yamazaki et al. | 345/87 |
| 6,573,952 B1 * | 6/2003 | Yamazaki et al. | 349/13 |
| 6,589,824 B2 * | 7/2003 | Ohtani et al. | 438/151 |
| 6,599,783 B2 * | 7/2003 | Takatoku | 438/148 |
| 6,617,203 B2 * | 9/2003 | Kim et al. | 438/149 |
| 6,624,473 B1 * | 9/2003 | Takehashi et al. | 257/344 |
| 6,635,504 B2 * | 10/2003 | Jang | 438/28 |
| 6,642,074 B2 * | 11/2003 | Hong et al. | 438/30 |
| 6,692,983 B1 * | 2/2004 | Chen et al. | 438/70 |
| 6,787,809 B2 * | 9/2004 | Hong et al. | 257/72 |

* cited by examiner

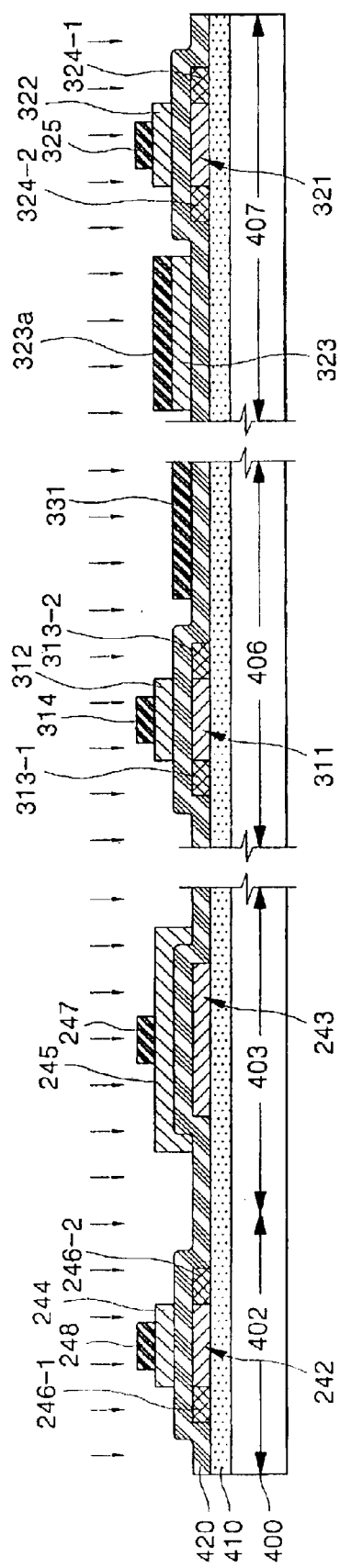

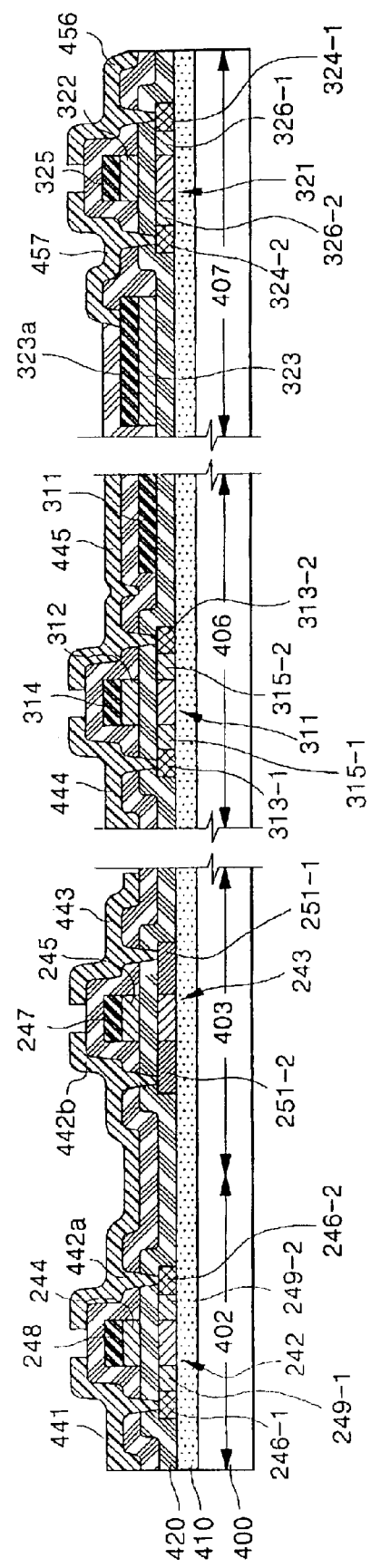

FLAT PANEL DISPLAY DEVICE

The present application is a divisional application of the U.S. patent application Ser. No. 10/121,676 filed Apr. 15, 2002 now U.S. Pat. No. 6,617,203.

BACKGROUND OF THE INVENTION

1. Field of the Invention

The present invention relates to a flat panel display device and a method of manufacturing the same, and, more particularly, to a flat panel display device manufactured according to a method using fewer masks and resulting in high brightness and simplified manufacturing.

2. Description of Related Art

In general, a flat panel display device includes a display panel and a driving circuit that drives the display panel. The display panel and the driving circuit are manufactured through different processes and then attached to each other. Thus, there is a problem in that the manufacturing process for each component is complicated, and the production cost for each is high.

In efforts to solve the problem, a technique is developed so that pixels and driving integrated circuits (ICs) are formed on a single substrate in such a way that the pixel is arranged on a display region of the substrate, and the driving ICs are arranged on a non-display region of the substrate. For example, in the case of an organic Electroluminescent (EL) display device, two thin film transistors (TFTs), a storage capacitor and an organic EL element are formed on the display region, and a CMOS transistor as a driving circuit element is formed on the non-display region.

FIG. 1 is a cross-sectional view illustrating a conventional flat panel display device having a CMOS transistor as a driving circuit element. A method of manufacturing the conventional flat panel display device is provided below with reference to FIG. 1.

First, a transparent insulating substrate 10 having a display region 11 and a non-display region 15 is provided. The display region 11 includes a first display region 12 on which a TFT used to drive the pixels is formed, and further includes a second display region 13 on which an organic EL element is formed. The non-display region 15 includes a first non-display region 16 on which an NMOS TFT is formed, and further includes a second non-display region 17 on which a PMOS TFT is formed.

A buffer layer is formed on the transparent insulating substrate 10. Then, first to third semiconductor layers 21 to 23 are formed on the buffer layer of the transparent insulating substrate 10 using a first mask. The first semiconductor layer 21 is arranged over the first non-display region 16, and the second semiconductor layer 22 is arranged over the second non-display region 17. The third semiconductor layer 23 is arranged over the first display region 12.

A gate insulating layer 40 is formed over the entire surface of the transparent insulating substrate 10. First to third gate electrodes 41 to 43 are formed on the gate insulating layer 40 using a second mask. The first gate electrode 41 is arranged over the first semiconductor layer 21, and the second gate electrode 42 is arranged over the second semiconductor layer 22. The third gate electrode 43 is arranged over the third semiconductor layer 22.

Using the first gate electrode 41 as a mask, an n-type low-density impurity is ion-implanted into the first semiconductor layer 21 to form first low-density source and drain regions 37 and 38.

Using a third mask, an n-type high-density impurity is ion-implanted into the first semiconductor layer 21 to form first high-density source and drain regions 31 and 32.

Hence, the first semiconductor layer 21 has a lightly doped drain (LDD) structure. However, when an ion-implanting process (used to form the first low-density source and drain regions 37 and 38) is omitted, the first semiconductor layer 21 has an offset structure.

Using a fourth mask that exposes the remaining portion except for the first non-display region 16, a p-type high-density impurity is ion-implanted into the second and the third semiconductor layers 22 and 23 to form second source and drain regions 33 and 34 and third source and drain regions 35 and 36, respectively.

At this point, the third source and drain regions 35 and 36 are formed by ion-implanting a p-type impurity so as to form a PMOS TFT as a TFT for driving pixels. However, in order to form an NMOS TFT as a TFT for driving pixels, during a third mask process, an n-type high-density impurity can be ion-implanted into the third semiconductor layer 23.

Subsequently, an interlayer insulating layer 50 is formed over the entire surface of the transparent insulating substrate 10. Then, using a fifth mask, the gate insulating layer 40 and the interlayer insulating layer 50 are simultaneously etched to form contact holes 51 to 56.

Thereafter, using a sixth mask, first to third source and drain electrodes 61 to 66 are formed. The first to the third source and drain electrodes 61 to 66 are electrically connected to the first to third source and drain regions 31 to 36 through the contact holes 51 to 56, respectively.

A passivation layer 70 is formed over the entire surface of the transparent insulating substrate 10. Using a seventh mask, the passivation layer 70 is etched to form via hole 71. The via hole 71 exposes a portion of either of the third source and drain electrodes 65 and 66. In FIG. 1, the via hole 71 exposes the third drain electrode 66.

Using an eighth mask, a pixel electrode 80 is formed over the second display region 13. The pixel electrode 80 serves as a lower electrode of the organic EL element and is made of a transparent conductive material. The pixel electrode 80 is also electrically connected to the third drain electrode 66 through the via hole 71.

A planarization layer 90 is formed over the entire surface of the transparent insulating substrate 10 and etched using a ninth mask to form an opening portion 91 that exposes a portion of the pixel electrode 80.

Even though not shown in FIG. 1, an organic EL layer is formed on the pixel electrode 80 to cover the opening portion 91. Also, an upper electrode is formed to cover the organic EL layer. Therefore, the conventional flat panel display device is completed.

However, since nine masks are required to manufacture the conventional flat panel display device as described above, the manufacturing process is quite complicated, thereby lowering a manufacturing yield. In addition, light emitting from the organic EL layer formed on the pixel electrode 80 has to pass through several layers, including the gate insulating layer 40, the interlayer insulating layer 50, and the passivation layer 70. Hence, most of the light emitting from the organic EL layer is lost due to multi-reflection. As a result, light transmittance is lowered as is the brightness of the panel.

SUMMARY OF THE INVENTION

To overcome the problems described above, preferred embodiments of the present invention provide a flat panel display device having a simplified manufacturing process.

It is another object of the present invention to provide a flat panel display device having a high brightness.

In order to achieve the above objects, the preferred embodiments of the present invention provide a method of manufacturing a flat panel display device including at least first to fourth TFTs, the first, the third, and the fourth TFTs having a first conductive type, the second TFT having a second conductive type. The method disclosed comprising: a) providing a substrate having a non-display region on which the first and second TFTs are formed, and a display region on which the third and fourth TFTs are formed; b) forming first to fourth semiconductor layers of the first to the fourth TFTs on the substrate; c) forming a gate insulating layer over the entire surface of the substrate; d) forming first to fourth conductive patterns and a pixel electrode on the gate insulating layer, such that the first to the fourth conductive patterns are formed over the first to the fourth semiconductor layers, and the pixel electrode is formed over a portion of the display region; e) forming first to fourth gate electrodes and a fifth conductive pattern, such that the first to the fourth gate electrodes are formed on the first to fourth conductive patterns, respectively, and the fifth conductive pattern is formed on the pixel electrode; f) ion-implanting a first conductive-type high-density impurity into the first, third, and fourth semiconductor layers to form first conductive type high-density source and drain regions; g) etching the first to fourth conductive patterns using the first to fourth gate electrodes as an etching mask; h) forming a photoresist pattern to expose a portion of the non-display region corresponding to the second semiconductor layer; and i) ion-implanting a second conductive-type high-density impurity into the second semiconductor layer to form second conductive-type high-density source and drain regions.

The method further includes, following step (g), ion-implanting a first conductive-type low-density impurity into the first to the fourth semiconductor layers to form first conductive-type low-density source and drain regions. The second conductive pattern has width sufficient to entirely cover the second semiconductor layer, and the first, third, and fourth conductive patterns have a width smaller than the first, third, and fourth semiconductor layers yet wider than the first, third, and fourth gate electrodes.

The present invention further provides a method of manufacturing a flat panel display device, including at least first to fourth TFTs, such that the first, third, and fourth TFTs having a first conductive type, and the second TFT having a second conductive type, the method comprising: a) providing a substrate having a non-display region on which the first and second TFTs are formed, and a display region on which the third and fourth TFTs are formed; b) forming first to fourth semiconductor layers of the first to the fourth TFTs on the substrate; c) forming a gate insulating layer over the entire surface of the substrate; d) forming first to fourth conductive patterns and a pixel electrode on the gate insulating layer, such that the first to fourth conductive patterns are formed over the first to fourth semiconductor layers, and the pixel electrode is formed over a portion of the display region; e) forming first to fourth gate electrodes and a fifth conductive pattern, such that the first to fourth gate electrodes are formed on the first to fourth conductive patterns, respectively, and the fifth conductive pattern is formed on the pixel electrode; f) ion-implanting a second conductive-type high-density impurity into the second semiconductor layer to form second conductive type high-density source and drain regions; g) etching the first to fourth conductive patterns using the first to fourth gate electrodes as an etching mask; h) forming a photoresist pattern to cover a portion of the non-display region corresponding to the second semiconductor layer; and i) ion-implanting a first conductive-type high-density impurity into the first, third, and fourth semiconductor layers to form first conductive-type high-density source and drain regions.

The method further includes the steps of forming an interlayer insulating layer over the entire surface of the substrate; forming first to fourth source and drain electrodes, the first to fourth source and drain electrodes electrically connected to the first to fourth high-density source and drain regions, and either of the fourth source and drain electrodes electrically connected to the fifth conductive pattern; forming a planarization layer over the entire surface of the substrate; and etching the fifth conductive pattern and the planarization layer to form an opening portion, the opening portion exposing a portion of the pixel electrode.

The first, third and fourth conductive patterns have width sufficient to entirely cover the first, third and fourth semiconductor layers, and the second conductive pattern has a width smaller than the second semiconductor layer and smaller than the second gate electrode. The fifth conductive pattern has a width equal to or wider than the pixel electrode. The first to fourth conductive patterns and the pixel electrode are made of a transparent conductive material. The first to fourth gate electrodes and the fifth conductive pattern are preferably made of aluminum (Al) or aluminum-alloy (Al-alloy).

The present invention further provides a flat panel display device. First to fourth semiconductor layers are formed on a substrate. The first to fourth semiconductor layers include first to fourth source and drain regions, respectively. The second source and drain regions have a different conductivity than do the first, third, and fourth source and drain regions. A gate insulating layer is formed over the entire surface of the substrate. First to fourth conductive patterns are formed over portions of the gate insulating layer corresponding to the first to fourth semiconductor layers, respectively. First to fourth gate electrodes are formed on the first to fourth conductive patterns. A pixel electrode is formed on a portion of the gate insulating layer adjacent to the fourth conductive pattern. An interlayer insulating layer is formed over the entire substrate. First to fourth source and drain electrodes are in contact with the first to fourth source and drain regions, respectively. A planarization layer is formed over the whole substrate. An opening portion exposes the pixel electrode.

The first to fourth conductive patterns are made of the same material as the pixel electrode. The pixel electrode is preferably made of a transparent conductive material. The first to fourth source and drain regions have a LDD structure or an offset structure. The flat panel display device further includes a fifth conductive pattern formed on the pixel electrode.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which:

FIGS. 2A to 2H are cross-sectional views illustrating a process of manufacturing a flat panel display device according to the present invention.

DETAILED DESCRIPTION OF PREFERRED EMBODIMENTS

Reference will now be made in detail to preferred embodiments of the present invention, an example of which is illustrated in the accompanying drawings.

Hereinafter, a flat panel display device according to the present invention is described with emphasis on an organic EL display device.

Figure 1:
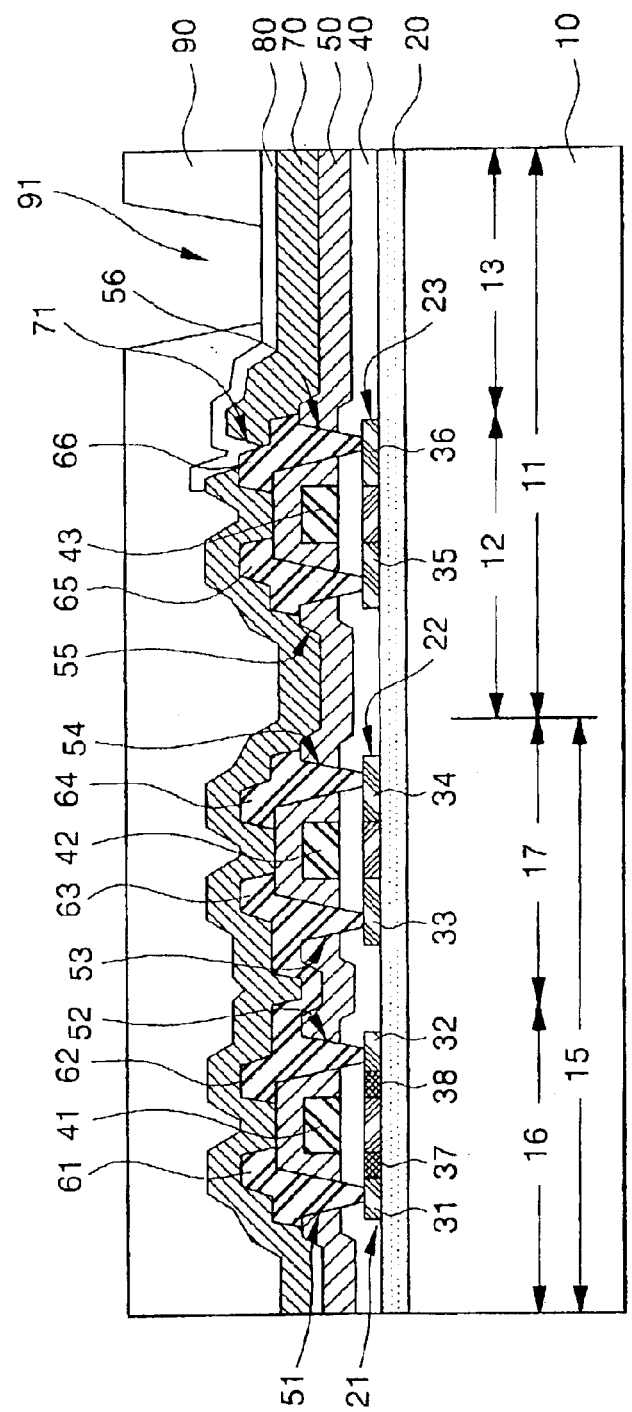
FIG. 1 is a cross-sectional view illustrating a conventional flat panel display device having a CMOS transistor as a driving circuit element.
Figure 2A:
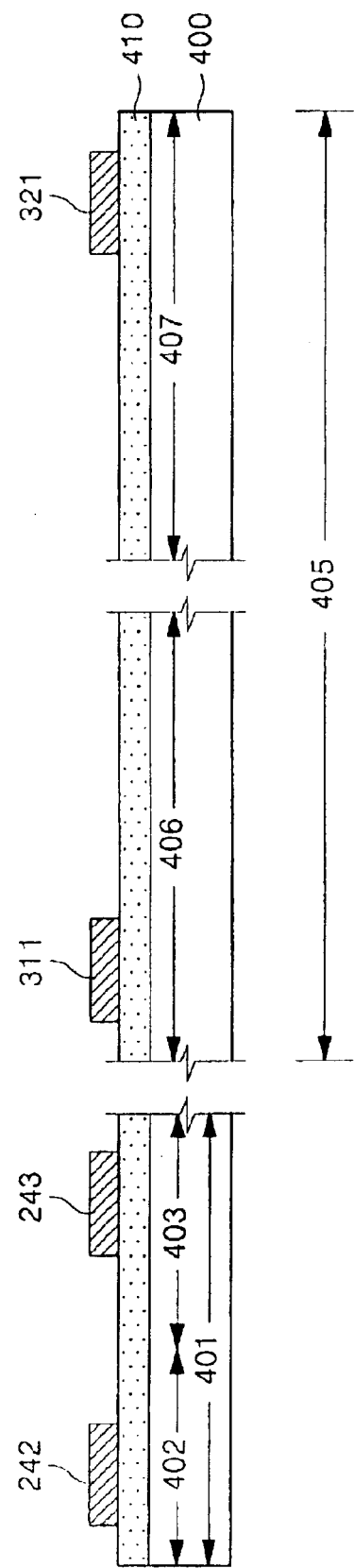

Referring to FIG. 2A, a transparent insulating substrate 400 having a non-display region 401 and a display region 405 is provided. The transparent insulating substrate 400 is preferably made of glass. The non-display region 401 includes a first non-display region 402 on which an NMOS thin film transistor (TFT) is formed, and further includes a second non-display region 403 on which a PMOS TFT is formed. The display region 405 includes a first display region 406 on which a first TFT and a storage capacitor are formed, and further includes a second display region 407 on which a second TFT and an organic EL element are formed.

A buffer layer 410 is formed on the transparent insulating substrate 400. The buffer layer 410 serves to prevent an impurity ion contained in the transparent insulating substrate 400 from being diffused into the TFTs formed on the transparent insulating substrate 400.

Then, a poly silicon layer is deposited on the buffer layer 410 and patterned using a first mask to form first to fourth semiconductor layers 242, 243, 311, and 321. The first semiconductor layer 242 is arranged over the first non-display region 402, and the second semiconductor layer 243 is arranged over the second non-display region 403. The third semiconductor layer 311 is arranged over the first display region 406, and the fourth semiconductor layer 321 is arranged over the second display region 407.

Alternatively, the semiconductor layers 242, 243, 311, and 321 can be formed by the following method: an amorphous silicon layer is first deposited on the buffer layer 410 and crystallized, using a technique such as an eximer laser annealing (ELA), a solid phase crystallization (SPC), or a metal induced lateral crystallization (MILC), so as to form a poly silicon layer on the buffer layer 410, and thereafter the poly silicon layer is patterned using a first mask as previously described.

Figure 2B:
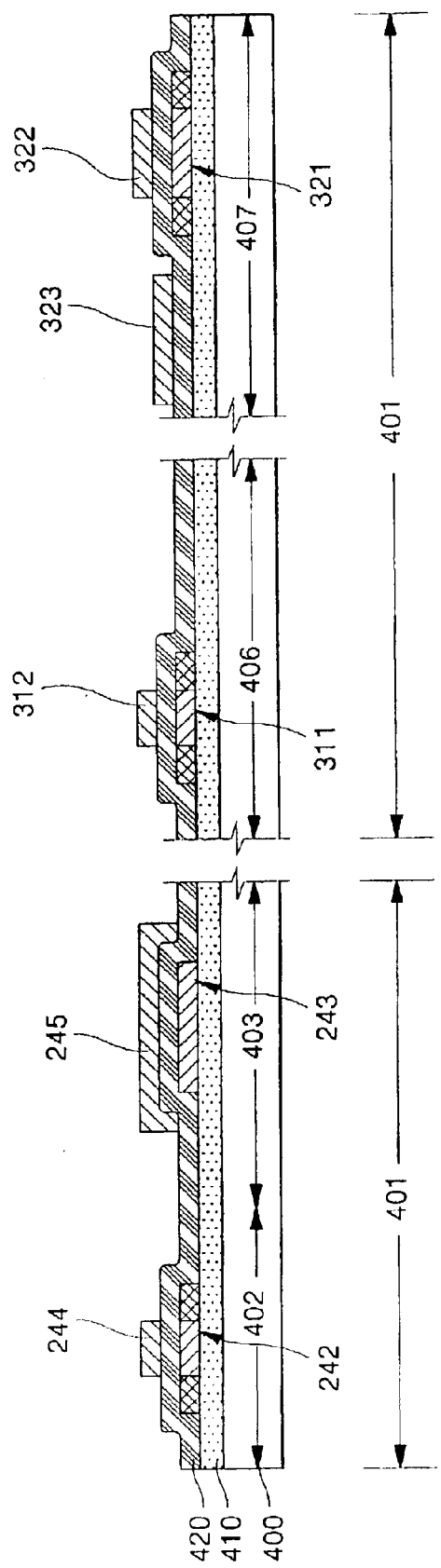

Referring now to FIG. 2B, a gate insulating layer 420 is formed over the entire surface of the transparent insulating substrate 400. A transparent conductive material layer is deposited and patterned using a second mask to form a pixel electrode 323 and to form first to fourth conductive patterns 244, 245, 312, and 322 on the gate insulating layer 420. The pixel electrode 323 is formed over the second display region 407. The first to fourth conductive patterns 244, 245, 312, and 322 are formed over the first to the fourth semiconductor layers 242, 243, 311, and 321, respectively. The transparent conductive material layer is preferably made of indium tin oxide (ITO) or indium zinc oxide (IZO).

The first conductive pattern 244 has a width narrower than the first semiconductor layer 242 yet wider than a first gate electrode which will be formed in a subsequent process. The third conductive pattern 312 has a width narrower than the third semiconductor layer 311 yet wider than a third gate electrode which will be formed in the subsequent process. The fourth conductive pattern 322 has a width narrower than the fourth semiconductor layer 321 yet wider than a fourth gate electrode which will be formed in the subsequent process. Therefore, the first, third, and fourth conductive patterns 244, 312 and 322 serve as an ion stopper to form an offset region or to form a lightly doped drain (LDD) region during an ion-implanting process used to form source and drain regions in the subsequent process. Meanwhile, the second conductive pattern 245 has a width sufficient to cover the second semiconductor layer 243. Therefore, the second conductive pattern 245 serve as an ion stopper to prevent an n-type impurity from being implanted into the second semiconductor layer 243 during a subsequent ion-implanting process.

Referring now to FIG. 2C, a first metal layer is deposited over the entire surface of the substrate 400 and is patterned using a third mask to form first to fourth gate electrodes 248, 247, 314, and 325, a first capacitor electrode 331, and a fifth conductive pattern 323a. The first metal layer is preferably made of Al or Al-alloy. The first to fourth gate electrodes 248, 247, 314, and 325 are formed on the first to fourth conductive patterns 244, 245, 312, and 322, respectively, and each has a width narrower than the first to fourth conductive patterns 244, 245, 312, and 322, respectively. The fifth conductive pattern 323a is formed on the pixel electrode 323 and has a width equal to or wider than the pixel electrode 323. Therefore, the fifth conductive pattern 323a serves as an etching mask to prevent the pixel electrode 323 from being etched during an etching process of the first to fourth conductive patterns 244, 245, 312, and 322.

Subsequently, using the first to fourth conductive patterns 244, 245, 312, and 322 as a mask, an n-type high-density impurity is ion-implanted to form first source and drain regions 246-1 and 246-2, third source and drain regions 313-1 and 313-2, and fourth source and drain regions 324-1 and 324-2. Here, since the second semiconductor layer 243 is entirely covered with the second conductive pattern 245, the n-type high-density impurity is not ion-implanted into the second semiconductor layer 243.

Next, using the first to fourth gate electrodes 248, 247, 314, and 325 as an etching mask, exposed portions of the first to fourth conductive patterns 244, 245, 312, and 322 are etched.

Figure 2D:
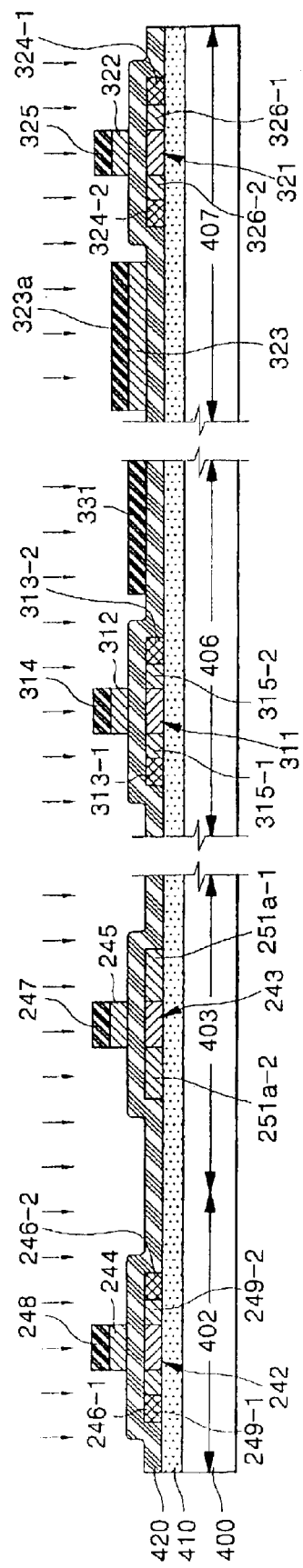

Referring now to FIG. 2D, using the gate electrodes 248, 314, and 325 as a mask, an n-type low-density impurity is ion-implanted into the semiconductor layers 242, 311 and 321 to form first source and drain regions 249-1 and 249-2, third source and drain regions 315-1 and 315-2, and fourth source and drain regions 326-1 and 326-2. Therefore, an NMOS TFT of a CMOS transistor has a lightly doped drain (LDD) structure, and the first and second TFTs also have the LDD structure.

At this point, when a process to ion-implant an n-type low-density impurity is omitted, the NMOS TFT and the first and second TFTs have an offset structure.

Meanwhile, the n-type low-density impurity is ion-implanted into the second semiconductor layer 243 of a PMOS transistor of a CMOS transistor to form low-density doped regions 251a-1 and 251a-2. However, since the low-density doped regions 251a-1 and 251a-2 are counter-doped with a p-type high-density impurity in a subsequent process, this does not affect formation of the PMOS transistor.

Figure 2E:
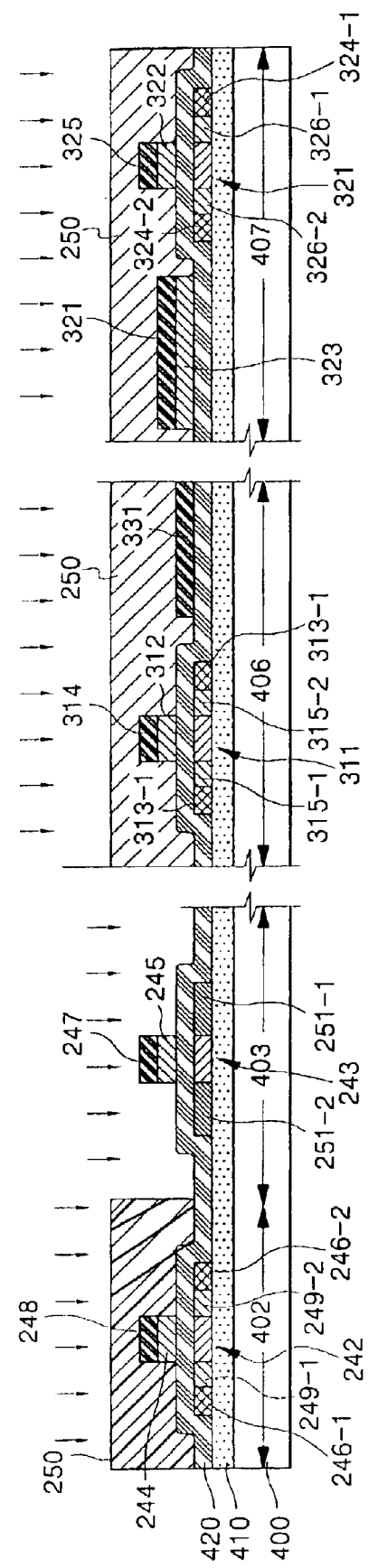

Referring now to FIG. 2E, a photoresist layer is coated on the entire surface of the transparent insulating substrate 400 and is patterned using a fourth mask to form a photoresist pattern 250. The photoresist pattern 250 exposes only the second non-display region 403. Using the photoresist pattern 250 as a mask, a p-type high-density impurity is ion-implanted into the second semiconductor layer 243 to form second source and drain regions 251-1 and 251-2. At this juncture, the low-density doped regions 251a-1 and 251a-2 are counter-doped with a p-type high-density impurity and become p-type high-density source and drain regions 251-1 and 251-2.

Figure 2F:
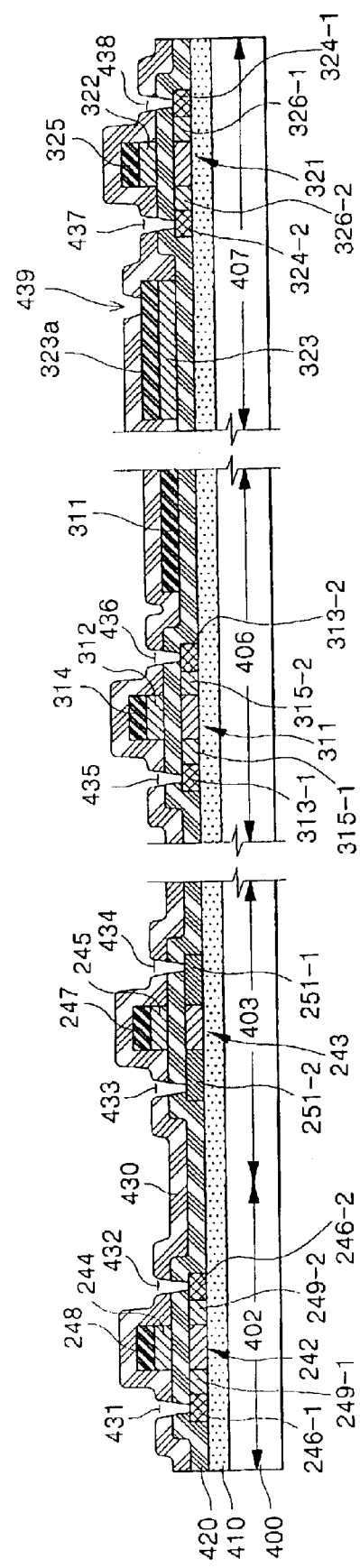

Referring now to FIG. 2F, after removing the photoresist pattern 250, an interlayer insulating layer 430 is formed over the entire surface of the transparent insulating substrate 400. The interlayer insulating layer 430 is etched using a fifth mask to form contact holes 431 to 439. The contact holes 431 and 432 expose the first high-density source and drain regions 246-1 and 246-2, respectively. The contact holes 433 and 434 expose the second source and drain regions 251-1 and 251-2, respectively. The contact holes 435 and 436 expose the third high-density source and drain regions 313-1 and 313-2, respectively. The contact holes 437 and 438 expose the fourth high-density source and drain regions 324-1 and 324-2, respectively. The contact hole 439 exposes a portion of the fifth conductive pattern 323a on the pixel electrode 323.

Referring now to FIG. 2G, a second metal layer is deposited over the entire surface of the transparent insulating substrate 400 and is patterned using a sixth mask to form first source and drain electrodes 441 and 442a, second source and drain electrodes 442b and 443, third source and drain electrodes 444 and 445, and fourth source and drain electrodes 456 and 457. The second drain electrode 442b and the third drain electrode 445 are integrally formed. The fourth drain electrode 457 extends over the first capacitor electrode 311 and also serves as a second capacitor electrode.

The first source and drain electrodes 441 and 442a are electrically connected to the first source and drain regions 246-1 and 246-2 through the contact holes 431 and 432, respectively. The second source and drain electrodes 442b and 443 are electrically connected to the second source and drain regions 251-1 and 251-2 through the contact holes 433 and 434, respectively. The third source and drain electrodes 444 and 445 are electrically connected to the third source and drain regions 313-1 and 313-2 through the contact holes 435 and 436, respectively. The fourth source and drain electrodes 456 and 457 are electrically connected to the fourth source and drain regions 324-1 and 324-2 through the contact holes 435 and 436, respectively. The fourth drain electrode 457 is also electrically connected to the fifth conductive pattern 323a through the contact hole 439.

Figure 2H:
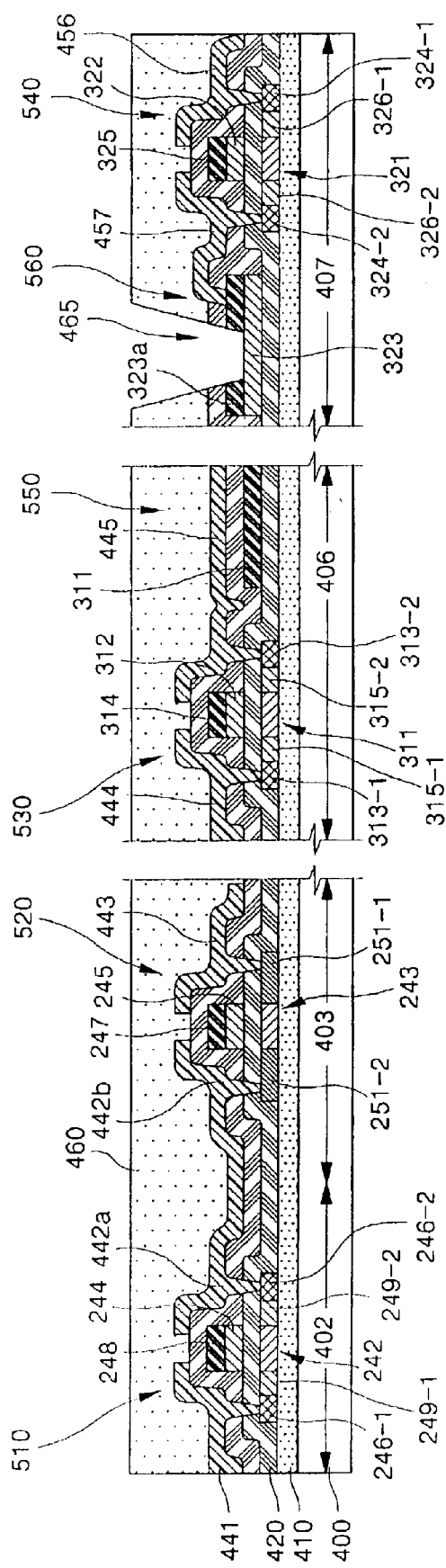

Referring now to FIG. 2H, a planarization layer 460 is formed over the entire surface of the transparent insulating substrate 400. Then, the fifth conductive pattern 323a and the planarization layer 460 are patterned using a seventh mask to form an opening portion 465. The opening portion 465 exposes a portion of the pixel electrode 323. At this juncture, the size of the opening portion 465 is smaller than that of the pixel electrode 323, so that an organic EL layer, which will be formed in the subsequent process, does not abut on an edge of the pixel electrode 323.

Subsequently, even though not shown in FIG. 2H, an organic EL layer is formed on the pixel electrode 323 to cover the opening portion 465. An upper electrode is formed to cover the organic EL layer. Therefore, the NMOS TFT 510 is formed on the first non-display region 402, and the PMOS TFT 520 is formed on the second non-display region 403. Also, the first TFT 530 and the storage capacitor 550 are formed on the first display region 406, and the second TFT 540 and the organic EL element 560 are formed on the second display region 407.

In the flat panel display device according to the present invention, the first and second TFTs arranged on the display region are the NMOS transistor, but the first and the second TFTs can become the PMOS transistor. In this case, as shown in FIG. 2B, the second to fourth conductive patterns 245, 312 and 322 are formed to entirely cover the second to fourth semiconductor layers 243, 311 and 321. Thereafter, the n-type high-density impurity is ion-implanted into only the first semiconductor layer 242. Moreover, as shown in FIG. 2E, the photoresist pattern 250 is formed to expose the remaining portion except for the first non-display region 402. Then, the p-type high-density impurity is ion-implanted into the second to fourth semiconductor layers 243, 311 and 321.

Also, a process to form the first to fourth conductive patterns can be omitted.

As described herein, the present invention provides numerous advantages. Since the flat panel display device is manufactured through a seven-mask process, the manufacturing process is significantly simplified, thereby improving the manufacturing yield. Also, since the TFTs having the offset structure or the LDD structure can be manufactured without an additional mask, an on/off current ratio can be improved. In addition, since the passivation layer and the interlayer insulating layer are not formed under the pixel electrode 323, transmittance of light emitting from the organic EL layer is significantly improved, thereby improving brightness of the panel.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A flat panel display device, comprising:
    first to fourth semiconductor layers formed on a substrate, the first to fourth semiconductor layers including first to fourth source and drain regions, respectively, the second source and drain regions having a different conductivity from the first, third, and fourth source and drain regions;
    a gate insulating layer formed over an entire first surface of the substrate;
    first to fourth conductive patterns formed on portions of the gate insulating layer and corresponding to the first to fourth semiconductor layers, respectively;
    first to fourth gate electrodes formed on the first to fourth conductive patterns;
    a pixel electrode formed on a portion of the gate insulating layer adjacent to the fourth conductive pattern;
    an interlayer insulating layer formed over said entire first surface of the substrate; first to fourth source and drain electrodes contacting the first to fourth source and drain regions, respectively;
    a planarization layer formed over said entire first surface of the substrate; and
    an opening portion exposing the pixel electrode.

2. The device of claim 1, wherein the first to fourth conductive patterns are constructed of the same material as the pixel electrode.

3. The device of claim 2, wherein the pixel electrode is constructed of a transparent conductive material.

4. The device of claim 1, wherein the first to fourth source and drain regions have a lightly doped drain structure or an offset structure.

5. The device of claim 1, further comprising a fifth conductive pattern formed on the pixel electrode.

6. A flat panel display device, comprising:

first to fourth semiconductor layers formed on a substrate, the first to fourth semiconductor layers including first to fourth source and drain regions, respectively, the second source and drain regions having a different conductivity from the first, third, and fourth source and drain regions;

a gate insulating layer formed over an entire first surface of the substrate;

first to fourth conductive patterns formed on portions of the gate insulating layer and corresponding to the first to fourth semiconductor layers, respectively;

first to fourth gate electrodes formed on the first to fourth conductive patterns;

a pixel electrode formed on a portion of the gate insulating layer adjacent to the fourth conductive pattern;

an interlayer insulating layer formed over said entire first surface of the substrate; first to fourth source and drain electrodes contacting the first to fourth source and drain regions, respectively;

a planarization layer formed over said entire first surface of the substrate; and an opening portion in the planarization layer exposing the pixel electrode;

wherein the pixel electrode is beneath the planarization layer.

7. The device of claim 6, wherein the first to fourth conductive patterns are constructed of the same material as the pixel electrode.

8. The device of claim 7, wherein the pixel electrode is constructed of a transparent conductive material.

9. The device of claim 6, wherein the first to fourth source and drain regions have a lightly doped drain structure or an offset structure.

10. The device of claim 6, further comprising a fifth conductive pattern formed on the pixel electrode.

11. A flat panel display device, comprising:

first to fourth semiconductor layers formed on a substrate, the first to fourth semiconductor layers including first to fourth source and drain regions, respectively, the second source and drain regions having a different conductivity from the first, third, and fourth source and drain regions;

a gate insulating layer formed over an entire first surface of the substrate;

first to fourth conductive patterns formed on portions of the gate insulating layer and corresponding to the first to fourth semiconductor layers, respectively;

first to fourth gate electrodes formed on the first to fourth conductive patterns;

a pixel electrode formed on a portion of the gate insulating layer adjacent to the fourth conductive pattern;

an interlayer insulating layer formed over said entire first surface of the substrate; first to fourth source and drain electrodes contacting the first to fourth source and drain regions, respectively;

a planarization layer formed over said entire first surface of the substrate; and an opening portion exposing the pixel electrode;

wherein the first to fourth conductive patterns are constructed of the same material as the pixel electrode.

12. The device of claim 11, wherein the pixel electrode is constructed of a transparent conductive material.

13. The device of claim 11, wherein the first to fourth source and drain regions have a lightly doped drain structure or an offset structure.

14. The device of claim 11, further comprising a fifth conductive pattern formed on the pixel electrode.

* * * * *